(12) United States Patent
Sakatani et al.

(10) Patent No.: US 8,598,464 B2
(45) Date of Patent: Dec. 3, 2013

(54) SOLDERING MATERIAL AND ELECTRONIC COMPONENT ASSEMBLY

(75) Inventors: Shigeaki Sakatani, Osaka (JP); Akio Furusawa, Osaka (JP); Kenichiro Suetsugu, Hyogo (JP); Taichi Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 274 days.

(21) Appl. No.: 12/999,411

(22) PCT Filed: Apr. 19, 2010

(86) PCT No.: PCT/JP2010/002812
§ 371 (c)(1),
(2), (4) Date: Feb. 3, 2011

(87) PCT Pub. No.: WO2010/122764
PCT Pub. Date: Oct. 28, 2010

(65) Prior Publication Data
US 2011/0120769 A1 May 26, 2011

(30) Foreign Application Priority Data

Apr. 20, 2009 (JP) ................................. 2009-101729

(51) Int. Cl.
*H05K 1/16* (2006.01)
*B23K 31/00* (2006.01)
*C22C 13/02* (2006.01)

(52) U.S. Cl.
USPC ........ 174/260; 228/180.1; 228/249; 420/561; 420/562

(58) Field of Classification Search
USPC .......... 174/260; 361/743, 760, 765, 767, 779, 361/807–809; 228/180.1–180.22, 245–255, 228/56.3; 420/561, 562
See application file for complete search history.

(56) References Cited

U.S. PATENT DOCUMENTS 5,256,370 A   10/1993  Slattery et al.
5,683,788 A * 11/1997  Dugan et al. .................. 428/209
(Continued)

FOREIGN PATENT DOCUMENTS

CN    1314229    9/2001
EP    1 724 050  11/2006
(Continued)

OTHER PUBLICATIONS

International Search Report issued Jul. 20, 2010 in International (PCT) Application No. PCT/JP2010/002812.
(Continued)

*Primary Examiner* — Jayprakash N Gandhi
*Assistant Examiner* — Dion Ferguson
(74) *Attorney, Agent, or Firm* — Wenderoth, Lind & Ponack, L.L.P.

(57) ABSTRACT

A solder material includes 1.0-4.0% by weight of Ag, 4.0-6.0% by weight of In, 0.1-1.0% by weight of Bi, 1% by weight or less (excluding 0% by weight) of a sum of one or more elements selected from the group consisting of Cu, Ni, Co, Fe and Sb, and a remainder of Sn. When a copper-containing electrode part of an electronic component is connected to a copper-containing electrode land of a substrate by using this solder material, a part having an excellent stress relaxation property can be formed in the solder-connecting part and a Cu—Sn intermetallic compound can be rapidly grown from the electrode land and the electrode part to form a strong blocking structure.

4 Claims, 8 Drawing Sheets

(56) References Cited

U.S. PATENT DOCUMENTS

| | | | |
|---|---|---|---|
| 5,733,501 | A | 3/1998 | Takao et al. |
| 6,176,947 | B1 | 1/2001 | Hwang et al. |
| 2003/0015575 | A1 | 1/2003 | Yamaguchi et al. |
| 2006/0239855 | A1 | 10/2006 | Nakatsuka et al. |
| 2007/0178007 | A1 | 8/2007 | Thantrong et al. |
| 2009/0057897 | A1* | 3/2009 | Patwardhan et al. ......... 257/738 |
| 2010/0084050 | A1 | 4/2010 | Kraemer et al. |

FOREIGN PATENT DOCUMENTS

| | | |
|---|---|---|
| EP | 2 177 305 | 4/2010 |
| JP | 6-15476 | 1/1994 |
| JP | 9-70687 | 3/1997 |
| JP | 10-193169 | 7/1998 |
| JP | 3040929 | 3/2000 |
| JP | 2001/035978 | 2/2001 |
| JP | 2001-168519 | 6/2001 |
| JP | 2002/120085 | 4/2002 |
| JP | 2004/188453 | 7/2004 |
| WO | 97/09455 | 3/1997 |
| WO | 97/43456 | 11/1997 |
| WO | 02/40213 | 5/2002 |
| WO | 2008/043482 | 4/2008 |
| WO | 2009/011392 | 1/2009 |

OTHER PUBLICATIONS

International Preliminary Report on Patentability and Written Opinion of the International Searching Authority (in English), issued Nov. 22, 2011 in International Application PCT/JP2010/002812.

Chinese Office Action issued Dec. 18, 2012 in corresponding Chinese Application No. 201080001875.3.

Supplemental European Search Report, issued Nov. 6, 2012 in EP Application 10 76 6826, which is a counterpart to the present application.

Kim et al., "Properties of low temperature Sn-Ag-Bi-In solder systems", Microelectronics Reliability, Elsevier Science Ltd., GB vol. 47, No. 7, May 31, 2007, pp. 1113-1119.

* cited by examiner

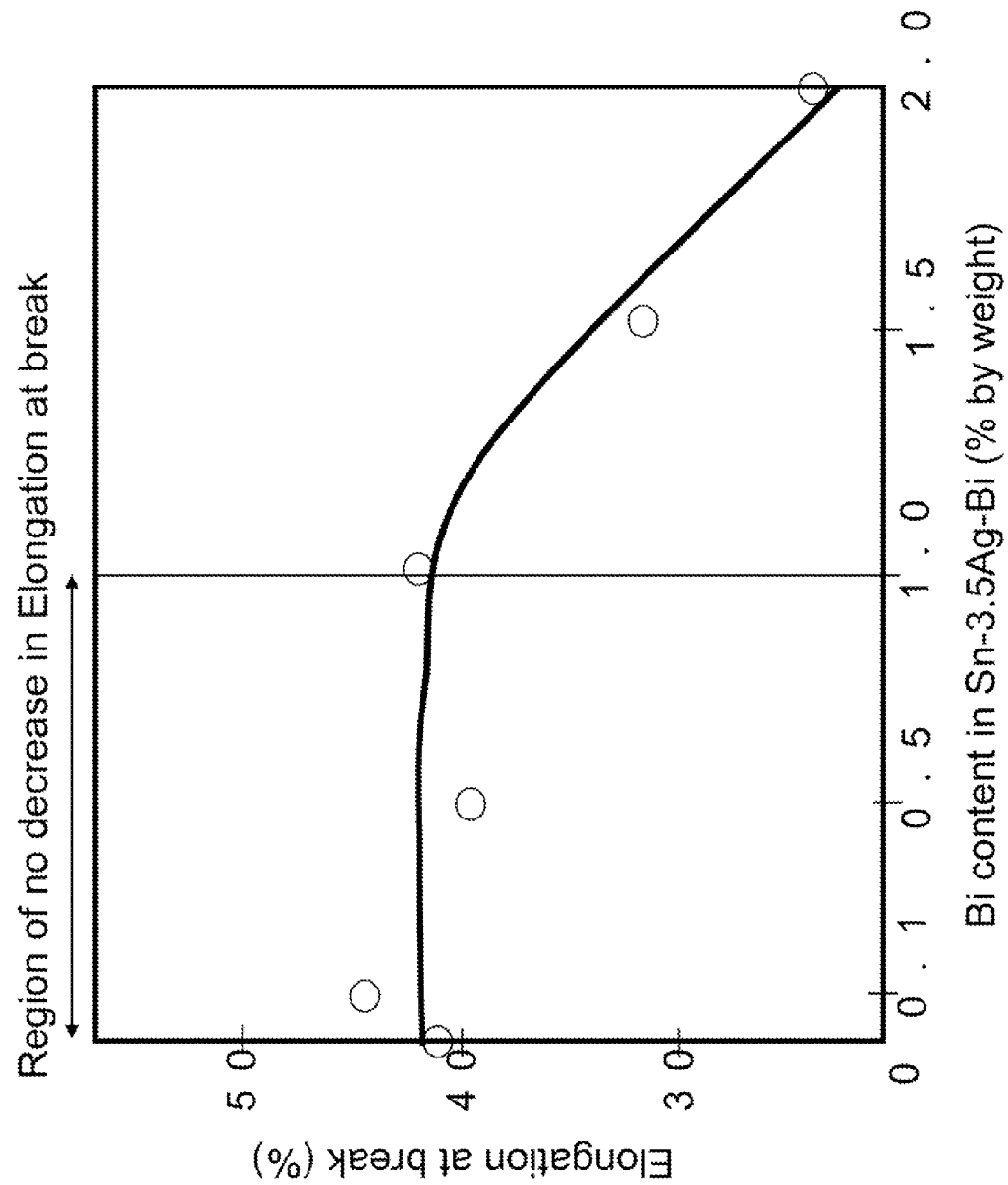

Fig. 6( a )
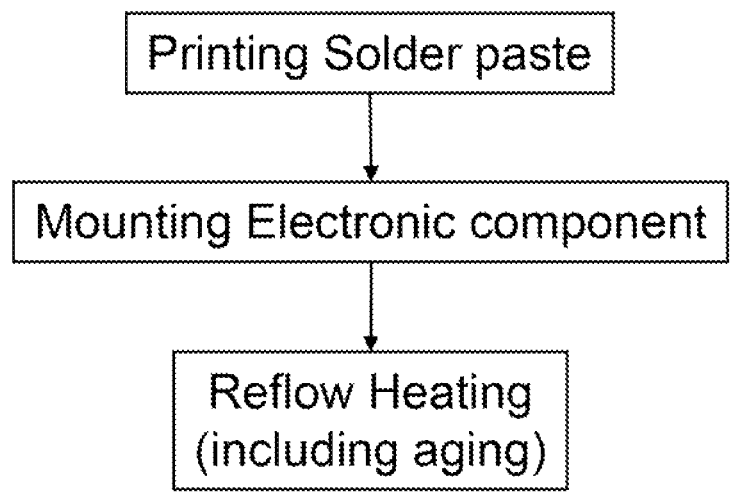
Fig. 6( b )
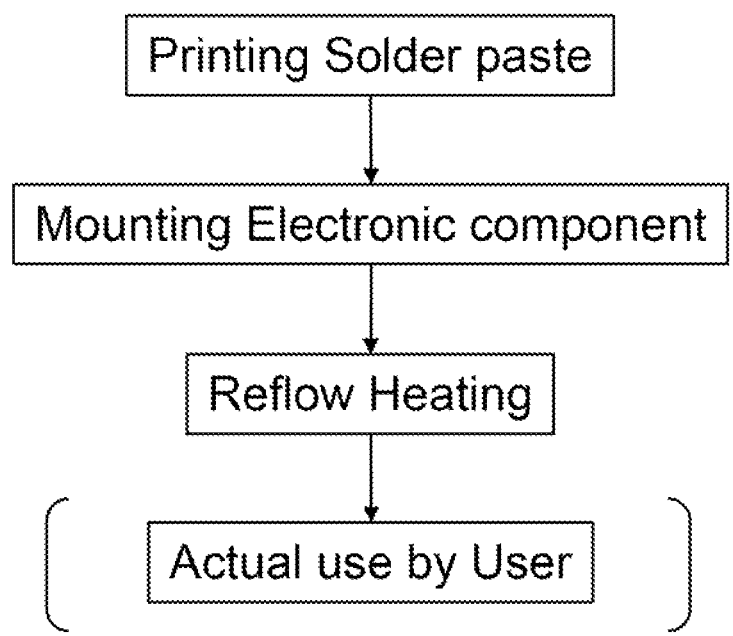

SOLDERING MATERIAL AND ELECTRONIC COMPONENT ASSEMBLY

BACKGROUND OF THE INVENTION

I. Technical Field

The present invention relates to a lead-free solder material (or soldering material), an electronic component assembly (or electronic component-connected article) using such solder material, and a process for producing an electronic component assembly.

In the present specification, for the purpose of explaining a metal composition of a solder material, a numeral or a numeral range is shown in some cases just prior to a metal element other than Sn, which means as used in the technical field of the art that the numeral or the numeral range denotes a weight percentage (% by weight) of each metal element in the metal composition and a remainder is composed of Sn.

II. Description of Related Art

In order to mounting an electronic component on a substrate, a connection by soldering is generally used as it attains superior electric connection and contributes to high productivity and workability.

As a solder material, an Sn—Pb eutectic solder has been used conventionally. However, as alternatives to the Sn—Pb eutectic solder, various lead-free solders are considered for introduction and put into practical use.

At present, as a lead-free material, Sn-0.7Cu, Sn-3.0Ag-0.5Cu, Sn-3.5Ag-0.5Bi-8.0In and so on are generally used (for example, see JP 3040929 B). These lead-free materials are reported as having a connection reliability equivalent to that of the Sn—Pb eutectic solder, and even after a heat cycle test, for example, between −40° C. and 85° C. with 1,000 cycles, they are able to show a connection quality of no occurrence of connection failure which would cause a function of a product to stop.

Another lead-free solder is proposed which is made from an Sn—Ag—In—Bi based solder added with at least one selected from the group consisting of Sb, Zn, Ni, Ga, Ge and Cu (see JP 2004-188453 A). More specifically, Patent Citation 2 discloses a lead-free solder comprising 0.5-5% by weight of Ag, 0.5-20% by weight of In, 0.1-3% by weight of Bi, 3% by weight or less of at least one selected from the group consisting of Sb, Zn, Ni, Ga, Ge and Cu, and a remainder of Sn. In examples thereof, it is described that no deformation was observed for a solder alloy even after a heat cycle test between −40° C. and 125° C. with 1,000 to 2,000 cycles.

Patent Citation 1: JP 3040929 B
Patent Citation 2: JP 2004-188453 A

SUMMARY OF THE INVENTION

For an application subjected to a severe temperature environment such as an engine compartment of an automobile, higher durability, more specifically thermal fatigue resistance is demanded for a solder-connecting part. As reliability requirements corresponding to an engine compartment of an automobile, a heat cycle test between −40° C. and 150° C. is conducted, and it is required even after 3000 cycles of this test to show no occurrence of connection failure (or poor connection) which would cause a function of a product to stop (hereinafter, simply referred to as "connection failure" in the present specification).

However, conventional lead-free solders as described above do not have a satisfactory thermal fatigue resistance for an application subjected to such severe temperature environment.

For example, when an electronic component assembly obtained by using a solder material of Sn-3.5Ag-0.5Bi-8.0In (JP 3040929 B) is subjected to a heat cycle test between −40° C. and 150° C., connection failure occurs within 1,000 cycles.

Furthermore, even in a case of an electronic component assembly obtained by reflow soldering using a solder material of Sn-3.5Ag-0.5Bi-8.0In-0.5Sb (JP 2004-188453 A), cleavage 67 as shown in FIG. 8 may occur (in FIG. 8, cleavage 67 shows a supposed path of cleavage).

The present inventors have found that cleavage (or crack) is generated in a solder-connecting part between an electronic component and a substrate, and this cleavage finally brings about disconnection, so that connection failure occurs; and have investigated the cause of it. An electronic component assembly 70 shown in FIG. 8 is produced by connecting a copper-composed electrode part 63a of an electronic component 63 to a copper-composed electrode land 61a (which is not covered by a resist 61b) of a substrate 61 by using Sn-3.5Ag-0.5Bi-8.0In-0.5Sb. As it is heated or time passes, a Cu—Sn intermetallic compound 65a grows on each of the surfaces of the electrode part 63 and the electrode land 61a while a solder base phase 65b is left continuously between these of the Cu—Sn intermetallic compound 65a. The Cu—Sn intermetallic compound 65a has a nature of hard but brittle, and it is supposed that a fragile connection interface is formed between the Cu—Sn intermetallic compound 65a and the solder base phase 65b, cleavage 67 is propagated through a continuous phase of the solder base phase 65b and finally brings about disconnection, so that connection failure occurs.

The present invention aims to provide a lead-free solder material which shows a high thermal fatigue resistance and is able to effectively reduce occurrence of connection failure that would cause a function of a product to stop, even in a severe temperature environment such as an engine compartment of an automobile. The present invention also aims to provide an electronic component assembly using such solder material, and a process for producing an electronic component assembly.

The present inventors have found that a stress relaxation in a solder-connecting part can be controlled by a content of In with respect to Sn, and that addition of at least one element selected from the group consisting of Cu, Ni, Co, Fe and Sb can promote formation and growth of a layer of an intermetallic compound formed between a solder material and a metal to be connected since the added element(s) is dissolved into the layer of the intermetallic compound, and finally accomplished the present invention.

According to one aspect of the present invention, there is provided a solder material comprising 1.0-4.0% by weight of Ag, 4.0-6.0% by weight of In, 0.1-1.0% by weight of Bi, 1% by weight or less (excluding 0% by weight) of a sum of one or more elements selected from the group consisting of Cu, Ni, Co, Fe and Sb, and a remainder of Sn.

Such solder material of the present invention can form a part having a good stress relaxation (solder base phase) in a solder-connecting part by setting an In content at 4.0-6.0% by weight, and can effectively prevent cleavage from occurring. Also, the solder material of the present invention can promote growth of a hard intermetallic compound (preferably a Cu—Sn intermetallic compound) formed between the solder material and a metal to be connected (preferably copper) by adding one or more elements selected from the group consisting of Cu, Ni, Co, Fe and Sb at 1% by weight or less (excluding 0% by weight) in sum total, and therefore can form a thermally and mechanically stable part (grown phase of the intermetallic compound, preferably a blocking structure by the intermetallic compound) in the solder-connecting part and can preclude generation and extension of cleavage.

With the use of such solder material of the present invention, even in a severe temperature environment such as an engine compartment of an automobile, it becomes possible to show a high thermal fatigue resistance and effectively reduce occurrence of connection failure that would cause a function of a product to stop.

In the present invention, a "solder material" means that it may comprise trace metal(s) which are unavoidably introduced thereto and/or may comprise additional component(s) other than metals (e.g. flux and so on), as long as a metal composition of the solder material is substantially composed of the denoted metals. Further, a "Cu—Sn intermetallic compound" means an alloy made of Cu and Sn as major components, and a "blocking structure" by the intermetallic compound means that members to be connected by the solder material are linked to each other through the intermetallic compound. It is not necessary that an entire space between these members is blocked by the intermetallic compound.

According to another aspect of the present invention, there is provided an electronic component assembly wherein a copper-containing electrode part of an electronic component is connected to a copper-containing electrode land of a substrate by a connecting part which is formed by using a solder material (which is simply referred to as a "solder-connecting part" or a "connecting part" in the present specification), and the solder material comprises 1.0-4.0% by weight of Ag, 4.0-6.0% by weight of In, 0.1-1.0% by weight of Bi, 1% by weight or less (excluding 0% by weight) of a sum of one or more elements selected from the group consisting of Cu, Ni, Co, Fe and Sb, and a remainder of Sn.

Such electronic component assembly of the present invention exerts similar functions and effects to those described above for the solder material of the present invention. This electronic component assembly may be an electronic circuit board, and the electronic circuit board can be realized with a better durability (in particular, thermal fatigue resistance) than that of conventional electronic circuit boards.

In the electronic component assembly of the present invention, a Cu—Sn intermetallic compound may block a space between the electrode part of the electronic component and the electrode land of the substrate at least partially in the connecting part which has been formed by using the solder material. However, the electronic component assembly of the present invention does not necessarily already have this blocking structure. Such blocking structure may also be formed during actual use by user.

According to another aspect of the present invention, there is provided a process for producing an electronic component assembly wherein a copper-containing electrode part of an electronic component is connected to a copper-containing electrode land of a substrate by a connecting part which is formed by using a solder material, which comprises connecting a copper-containing electrode part of an electronic component to a copper-containing electrode land of a substrate by a solder material which comprises 1.0-4.0% by weight of Ag, 4.0-6.0% by weight of In, 0.1-1.0% by weight of Bi, 1% by weight or less (excluding 0% by weight) of a sum of one or more elements selected from the group consisting of Cu, Ni, Co, Fe and Sb, and a remainder of Sn, and growing a Cu—Sn intermetallic compound from both of the electrode part of the electronic component and the electrode land of the substrate by heat treatment until the Cu—Sn intermetallic compound blocks a space between the electrode part of the electronic component and the electrode land of the substrate at least partially in the connecting part which is formed by using the solder material.

Such production process of the present invention can intentionally produce the electronic component assembly which already has the above described blocking structure by quite simple procedures.

According to the present invention, there is provided a lead-free solder material by which solder-connecting part can be composed of a part having a good stress relaxation (solder base phase) and a thermally and mechanically stable part (grown phase of an intermetallic compound, preferably a blocking structure by the intermetallic compound), and therefore which shows a high thermal fatigue resistance and can effectively reduce occurrence of connection failure that would cause a function of a product to stop, even in a severe temperature environment such as an engine compartment of an automobile.

Also, according to the present invention, there is also provided an electronic component assembly which can exert similar functions and effects to those described above. This electronic component assembly may be an electronic circuit board, and the electronic circuit board can be realized with a better durability (in particular, thermal fatigue resistance) than that of conventional electronic circuit boards.

Further, according to the present invention, an electronic component assembly which already has a blocking structure by an intermetallic compound, which contributes to improvement in a thermal fatigue resistance, can be produced intentionally.

BRIEF DESCRIPTION OF THE DRAWINGS

FIG. 5 is a graph showing a relation between a Bi content in Sn-3.5Ag—Bi and elongation at break.

FIG. 6 shows two kinds of flow diagrams of steps for explaining a process for producing an electronic component assembly of the present invention, wherein FIG. 6(a) is a flow diagram of steps for producing the electronic component assembly in the embodiment of FIG. 1, and FIG. 6(b) is another flow diagram of steps.

FIG. 7 shows SEM photographs of a solder-connecting part of an electronic component assembly, wherein

DETAILED DESCRIPTION OF THE INVENTION

Hereinafter, embodiments of the present invention will be described with reference to drawings.

(Electronic Component Assembly)

Figure 1:
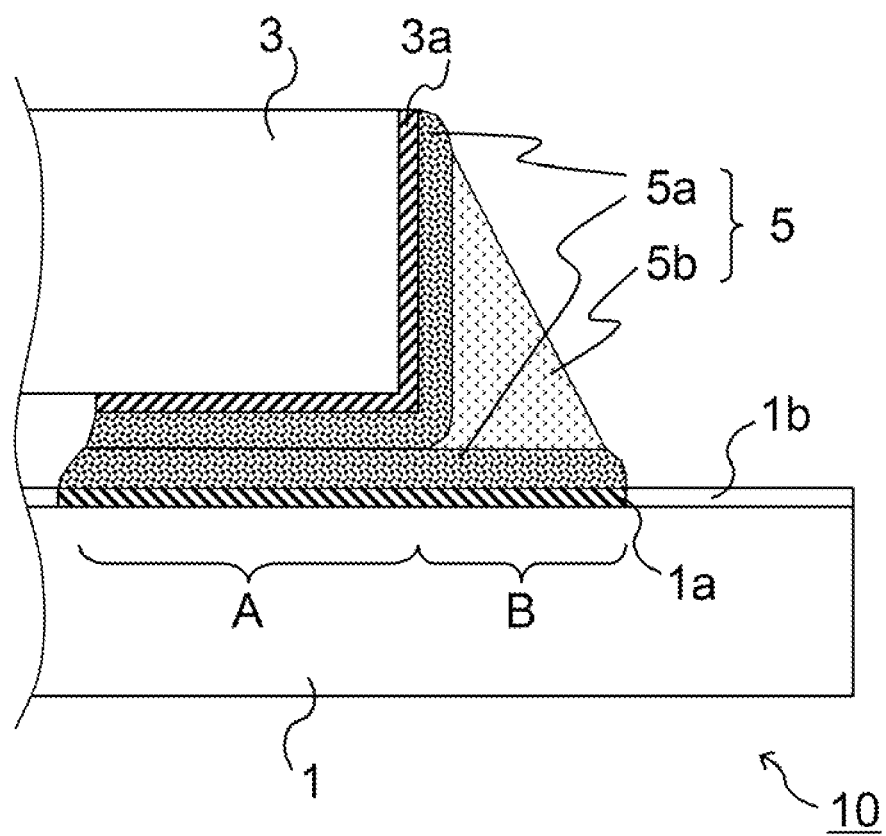
FIG. 1 schematically shows a sectional view of a part of an electronic component assembly in which an electronic component is connected to a substrate by using a solder material in one embodiment of the present invention (a right half of the electronic component is shown together with the underlying substrate).

As shown in FIG. 1, in an electronic component assembly 10 of this embodiment, a copper-containing electrode part 3a of an electronic component 3 is connected to a copper-containing electrode land 1a (which is not covered by a resist 1b) of a substrate 1 by a connecting part (solder-connecting part) 5 which is formed by using a solder material.

As the solder material, a lead-free solder material comprising 1.0-4.0% by weight of Ag, 4.0-6.0% by weight of In, 0.1-1.0% by weight of Bi, 1% by weight or less (excluding 0% by weight) of a sum of one or more elements selected from the group consisting of Cu, Ni, Co, Fe and Sb, and a remainder of Sn is used.

In the connecting part 5 formed by using this solder material, a space between the electrode part 3a of the electronic component 3 and the electrode land 1a of the substrate 1 is at least partially blocked (or linked) by a Cu—Sn intermetallic compound 5a. The Cu—Sn intermetallic compound 5a is formed from Sn in the solder material and Cu derived from the electrode 3a and the electrode land 1a, and grows from the electrode 3a and the electrode land 1a respectively, and then these compounds contact or unites with each other to block the space between the electrode 3a and the electrode land 1a (see FIG. 1). In the connecting part 5, a part other than the Cn-Sn intermetallic compound 5a is composed of a solder base phase (or solder bulk phase derived from the solder material and left after the formation of the Cn-Sn intermetallic compound) 5b. Since the space between the electrode 3a and the electrode land 1a is at least partially blocked by the Cu—Sn intermetallic compound 5a, the solder base phase 5b is prevented from existing as a continuous layer which extends all over the space between them.

Figure 2:
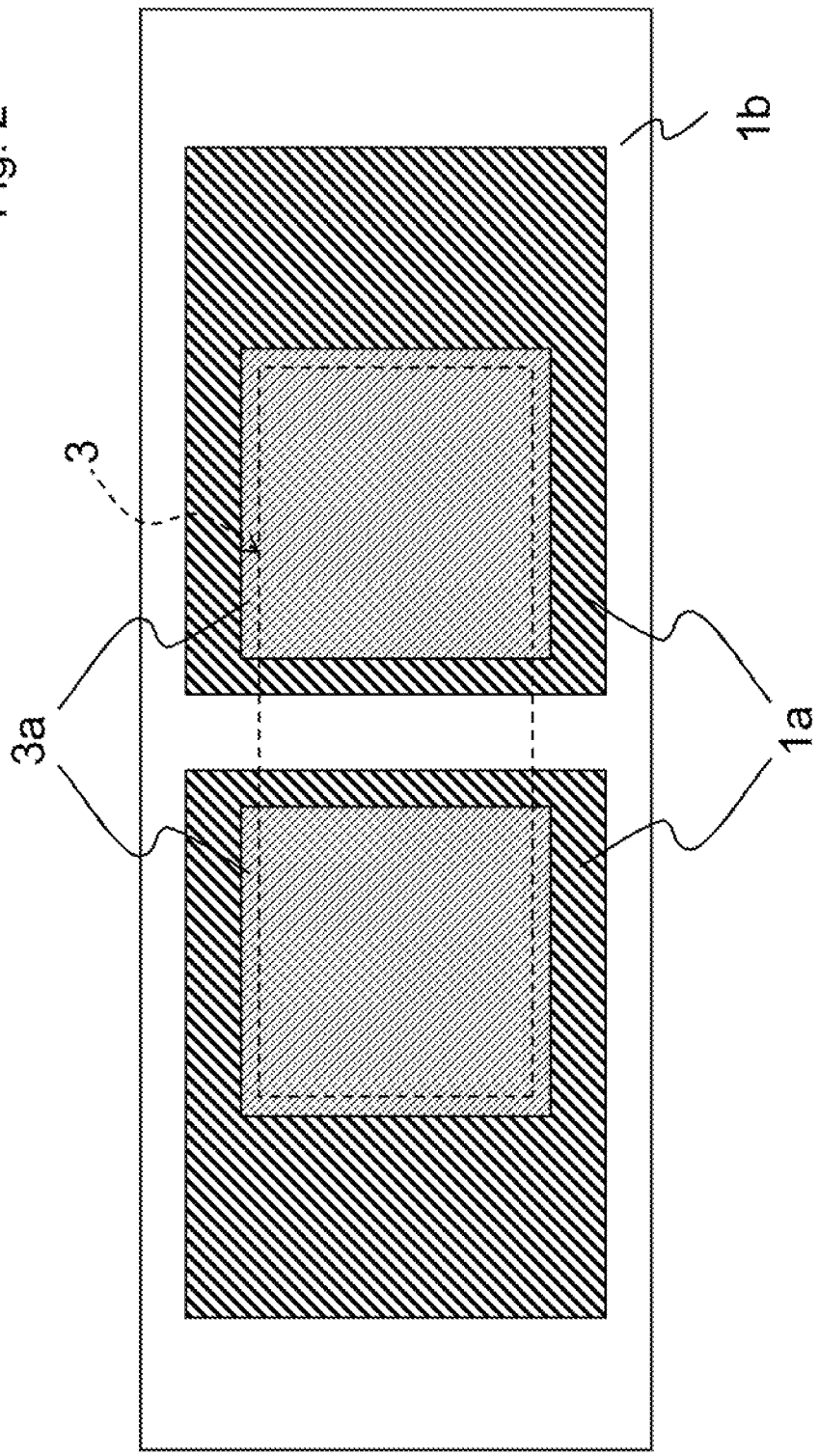
FIG. 2 shows a top view of the electronic component assembly in the embodiment of FIG. 1, wherein an electrode part of the electronic component is projected on a surface of the substrate.

Regarding the embodiment shown in the drawings, the profile of the connecting part 5 may generally have a shape resulted by subtracting the electronic component 3a and the electrode part 3a from a truncated four-sided pyramid having a base as the electrode land 1a and a top as an upper edge of the electrode part 3a (upper end shown with the lead line of the electrode part 3a in FIG. 1). In general, the connecting part 5 is composed integrally from an intervening part with which the electrode land 1a and the electrode part 3a are opposed to each other (of which projected region is shown by a symbol "A" in FIG. 1, corresponding to a region covered by the electrode part 3a in FIG. 2) and a fillet part surrounded by a remaining un-opposed region of the electrode land 1a, a plane including a remaining region of the electrode part 3a and generally perpendicular to the substrate's plane, and an inclined plane between the edges of them (of which projected region is shown by a symbol "B" in FIG. 1, corresponding to a region revealing the electrode land 1a in FIG. 2). At least part of, preferably most of, and more preferably substantially whole of the part A with which the electrode part 3a and the electrode land 1a are opposed to each other is blocked by the Cu—Sn intermetallic compound 5a, so that the solder base phase 5b is prevented from existing as a continuous phase in the part A and comes to exist in the fillet part B. FIGS. 1 and 2 show an exemplary case where a chip component is used as the electronic component 3 (in FIG. 2, a region surrounded by a dashed line is a projected region of the electronic component 3).

Since the used solder material comprises In at 4.0-6.0% by weight, the solder base phase 5b is comparatively soft. Since the electrode part 3a and the electrode land 1a are connected by such solder base phase 5b at the part other than the above described blocking structure (the fillet part B in the embodiment shown in the drawings), a stress can be relaxed in this part, so that occurrence of cleavage (crack) can be prevented effectively.

In contrast, since the Cu—Sn intermetallic compound is hard and thermally and mechanically stable, the strong blocking structure by the Cu—Sn intermetallic compound 5a is formed between the electrode part 3a and the electrode land 1a (the part A under the electronic component 3 in the embodiment shown in the drawings) to be able to connect the electronic component to the substrate with a high strength. Since the used solder material is added with at least one element selected from the group consisting of Cu, Ni, Co, Fe and Sb at 1% by weight or less (excluding 0% by weight) in sum total, the added element(s) is dissolved into the layer of the intermetallic compound 5a to promote the growth of the layer, and the strong blocking structure can be rapidly grown between the electrode part 3a and the electrode land 1a, and therefore it is possible to effectively prevent cleavage from occurring and extending. Such blocking structure can be formed stably and assuredly by adding one or more elements of Cu, Ni, Co, Fe and Sb at a certain amount.

This electronic component assembly 10 shows a high thermal fatigue resistance and is able to effectively reduce occurrence of connection failure that would cause a function of a product to stop, even in a severe temperature environment such as an engine compartment of an automobile. For example, after subjecting a heat cycle test between −40° C. and 150° C. with 3,000 cycles, it is possible to attain connection quality with no occurrence of connection failure which would cause a function of a product to stop.

(Solder Material)

Next, the composition of the solder material of the present invention is explained in detail. As mentioned in the above, the lead-free solder material comprising 1.0-4.0% by weight of Ag, 4.0-6.0% by weight of In, 0.1-1.0% by weight of Bi, 1% by weight or less (excluding 0% by weight) of a sum of one or more elements selected from the group consisting of Cu, Ni, Co, Fe and Sb, and a remainder of Sn is used.

Ag Content

In an Sn—Ag based solder, Ag crystallizes out as an $Ag_3Sn$ compound around a β-Sn phase and may play a role in reducing deformation of the solder due to a thermal or mechanical external force. In order to obtain a high thermal fatigue resistance, it is necessary to contain Ag to some extent. In order to pass a heat cycle test from −40° C. to 150° C., an Ag content is preferably 1.0% by weight or more.

Figure 3:
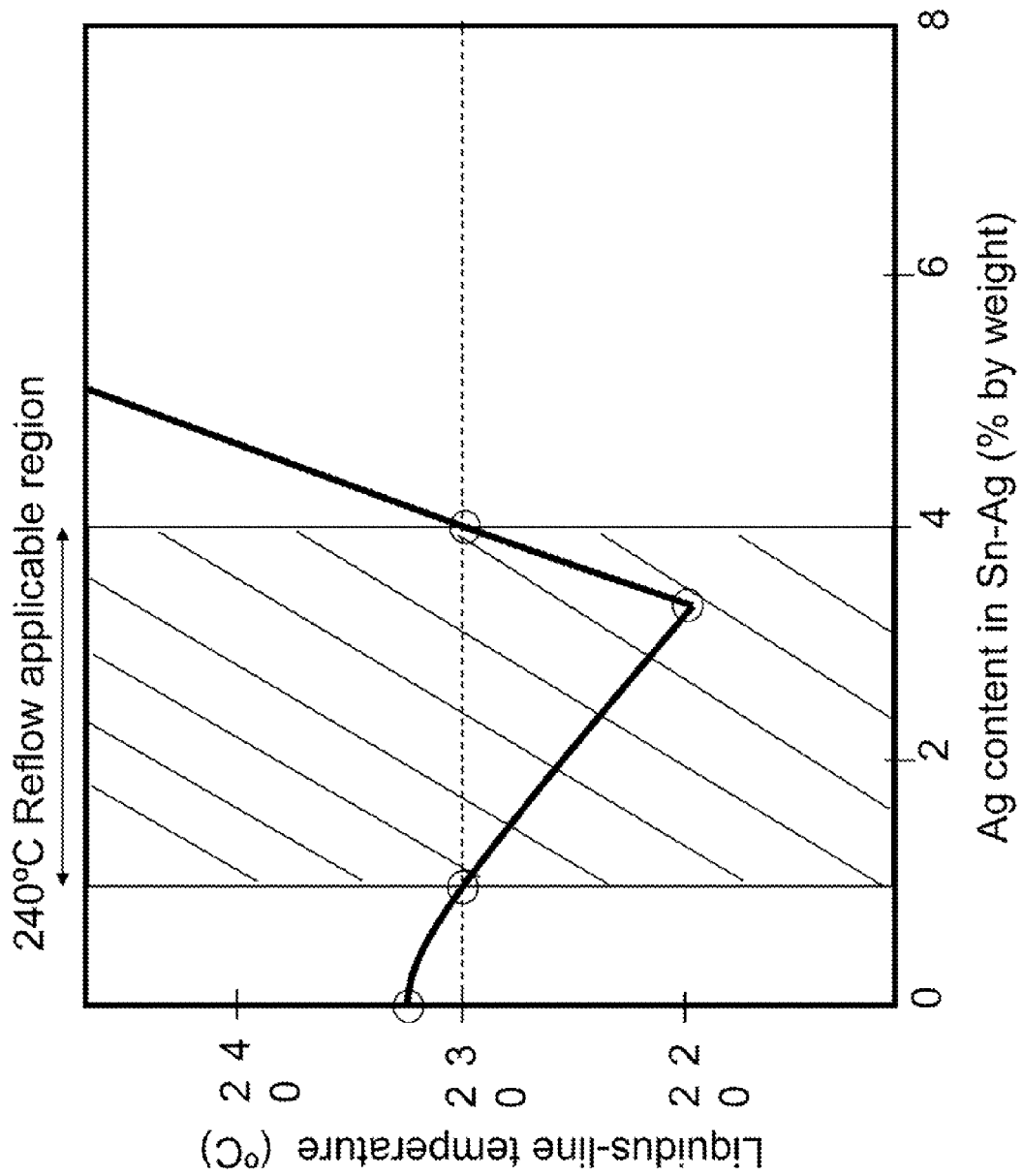
FIG. 3 is a graph showing a relation between an Ag content in Sn—Ag and a liquidus-line temperature.

In addition, the Ag content largely affects on a melting point of the solder. FIG. 3 is a graph resulted by investigating a relation between the Ag content in Sn—Ag and a liquidus-line temperature. At the Ag content of 0% by weight, it showed 232° C. corresponding to the melting point of Sn. As the Ag content was increased from 0% by weigh, the liquidus-line temperature dropped. At the Ag content of 3.5% by weight, it was decreased to 221° C. corresponding to an Sn—Ag eutectic temperature. As the Ag content was further increased from 3.5% by weight, the liquidus-line temperature was sharply increased.

In general, in order to uniformly melt a solder by reflow soldering, it is preferable that a reflow peak temperature is not less than the solder's liquidus-temperature plus 10° C. Further, considering a heatproof temperature of an electronic component, the reflow peak temperature is preferably not more than 240° C. Therefore, the solder's liquidus-temperature is preferably not more than 230° C. From FIG. 3, it is understood that satisfying the solder's liquidus-temperature not more than 230° C., the Ag content in Sn is 1.0-4.0% by weight.

Thus, for the solder material of the present invention, the Ag content in its metal composition is 1.0-4.0% by weight.

In Content

In an Sn—Ag—Bi—In based solder, In is dissolved into an Ag—Sn compound phase or a β-Sn phase, or exists as a γ-Sn(In) phase. A ratio of a γ-Sn phase in the solder varies depending on an In content and a temperature. Especially in a case of the Sn—Ag—Bi—In based solder, when a temperature reaches and exceeds a certain temperature by addition of heat, a transformation behavior from the β-Sn phase to the γ-Sn phase occurs to cause autogenous deformation of the solder, and the fillet will lose its shape largely. Therefore, it is preferable not to cross the temperature at which the transformation behavior occurs (transformation temperature) during a heat cycle test or actual use by user.

Figure 4:
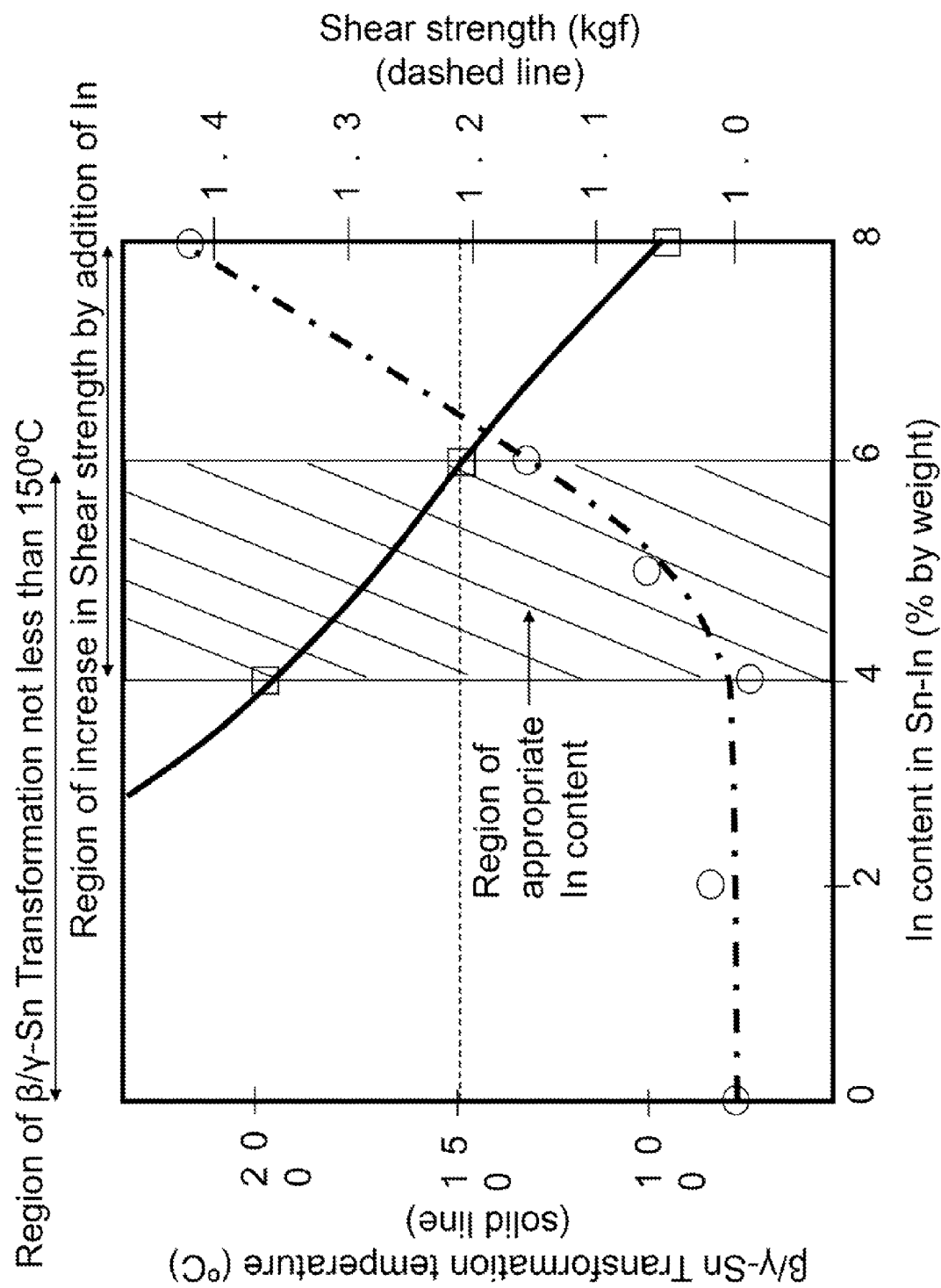
FIG. 4 is a graph showing relations between an In content in Sn—In and an Sn transformation temperature (solid line) and a shear strength of a solder-connecting part (dashed line).

Similarly to the ratio of the γ-Sn phase, the transformation temperature between the β-Sn phase and the γ-Sn phase (simply referred to as the Sn transformation temperature) also varies depending on the In content. In FIG. 4, a graph shown by a solid line is a graph resulted by investigating the Sn transformation temperature with respect to the In content in Sn—In. As the In content was increased, the Sn transformation temperature was decreased. At the In content of 4% by weight, the Sn transformation temperature was about 200° C. When the In content was increased to 6.0% by weight, the Sn transformation temperature was decreased to 150° C. When the In content was further increased to 8.0% by weight, the Sn transformation temperature was decreased to 100° C.

Accordingly, in order to assure a heat resistance of the solder-connecting part not less than 150° C., the In content is preferably not more than 6.0% by weight.

The In content also affects on a strength of the solder-connecting part. More specifically, as the In content is increased, the γ-Sn(In) phase enlarges to improve the strength of the solder-connecting part. In FIG. 4, a graph shown by a dashed line is a graph resulted by investigating a shear strength of the solder-connecting part with respect to the In content in Sn—In. In a range of the In content from 0% but less than 4.0% by weight, an effect of increase in the connecting strength by addition of In was not observed. In a range of the In content not less than 4.0% by weight, an increasing trend of the connecting strength was remarkably observed.

This shear strength was measured on an electronic component assembly shown in FIG. 1 which was prepared with the conditions below.

Substrate 1: High Tg type, high heat resistant substrate R-1755T, double-sided with copper, thickness of 1.2 mm (Panasonic Electric Works Co., Ltd.)

Electronic land 1a: Cu land, thickness of 35 μm, having subjected to surface treatment by a pre-flux preparation agent ("Tough-Ace", SHIKOKU CHEMICALS CORPORATION)

Resist 1b: High heat resistant resist (TAIYO INK MFG. CO., LTD.)

Electronic component 3: Chip capacitor, size of 1005, (TDK Corporation, C1005)

Electrode part 3a: Cu electrode (TDK Corporation, C1005)

Mounting process: reflow soldering (240° C.)

Accordingly, in order to obtain the high connection strength in the solder-connecting part, the In content is preferably not less than 4.0% by weight.

Thus, for the solder material of the present invention, the In content in its metal composition is 4.0-6.0% by weight.

Bi Content

By adding Bi to an Sn—Ag—In based solder, a Young's modulus of the solder-connecting part is increased to improve its mechanical strength. In order to obtain an effect of improvement in the mechanical strength, it is necessary to contain Bi to some extent, and a Bi content is preferably not less than 0.1% by weight.

However, as the Bi content is increased, elongation at break tends to be decreased since segregation of Bi occurs. FIG. 5 is a graph resulted by investigating a relation of the elongation at break with respect to the Bi content in Sn-3.5Ag—Bi, when Bi is added to an Sn-3.5Ag solder. In a region of the Bi content from 0% but not more than 1.0% by weight, the elongation at break was about 41.5% generally irrespective of the Bi content. In a range of the Bi content not less than 1.0% by weight, the solder became hard rapidly, and the elongation at break was decreased to 22% at the Bi content of 2.0% by weight. In order to assure reliability of the solder-connecting part, it is preferable not to decrease ductility (elongation at break) of the solder. Therefore, in order to avoid substantial decrease in the elongation at break, the Bi content is preferably not more than 1.0% by weight.

Thus, for the solder material of the present invention, the Bi content in its metal composition is 0.1-1.0% by weight.

Added Amount of Cu, Ni, Co, Fe and Sb

When such an Sn-(1.0-4.0)Ag-(4.0-6.0)In-(0.1-1.0)Bi in the above is added with at least one element selected from the group consisting of Cu, Ni, Co, Fe and Sb, the added element(s) is able to be dissolved into an interface reaction layer to promote formation and growth of the Cu—Sn intermetallic compound.

However, it such elements) is added excessively, the added element(s) comes into a solid solution or crystallizes in not only the interface reaction layer, but also the solder base phase, so that the solder-connecting part becomes hard and brittle.

Samples of Sn-(1.0-4.0)Ag-(4.0-6.0)In-(0.1-1.0)Bi added with the above element(s) variously were subjected to a drop strength test, and as a result of the test, the number of the samples which did not pass the test is shown in Table 1. As the Sn-(1.0-4.0)Ag-(4.0-6.0)In-(0.1-1.0)Bi in the test, Sn-4.0Ag-1.0Bi-6.0In and Sn-1.0Ag-0.1Bi-4.0In were selected, the former would be the hardest solder composition and the latter would be the softest solder composition among the metal composition range of the solder material of the present invention. The "added amount" of the added element means a substituted amount of Sn with the added element. Thus, the "added amount" of the added element corresponded to the content of this added element in the metal composition of the solder material, and the respective contents of Ag, In and Bi had no difference between before and after the addition.

This drop strength test was conducted as follows. With the use of a solder material having various metal compositions shown in Table 1, an electronic component assembly shown in FIG. 1 was prepared with the conditions below. A TEG (Test element group) was prepared by attaching an amount of Cu to a backside of the substrate of thus prepared electronic component assembly so that it had a total weight of 150 g. After the TEG was subjected to free falling from a height of 150 cm fifty times, whether the assembly passed an electric continuity check or not was examined for this test. The number of the samples (N) was five for each of the metal compositions.

Substrate 1: FR-4 substrate, double-sided with copper, thickness of 1.2 mm (Panasonic Electric Works Co., Ltd.)

Electronic land 1a: Cu land, thickness of 35 μm, having subjected to surface treatment by a pre-flux preparation agent ("Tough-Ace", SHIKOKU CHEMICALS CORPORATION)

Resist 1b: High heat resistant resist (TAIYO INK MFG. CO., LTD.)

Electronic component 3: Chip component, size of 5750, (Nippon Chemi-Con Corporation, C5750)

Electrode part 3a: Cu electrode (Nippon Chemi-Con Corporation, C5750)

Mounting process: reflow soldering (240° C.)

TABLE 1

Results of Drop strength test

| | Added amount (% by weight) | | | | | |
|---|---|---|---|---|---|---|
| | 0.05 | 0.1 | 0.5 | 1 | 1.5 | 2 |
| Sn—4Ag—1Bi—6In (Cu addition) | 0 | 0 | 0 | 0 | 1 | 2 |
| Sn—4Ag—1Bi—6In (Ni addition) | 0 | 0 | 0 | 0 | 1 | |
| Sn—4Ag—1Bi—6In (Co addition) | 0 | 0 | 0 | 0 | 2 | |
| Sn—4Ag—1Bi—6In (Fe addition) | 0 | 0 | 0 | 0 | 2 | |
| Sn—4Ag—1Bi—6In (Sb addition) | 0 | 0 | 0 | 0 | 3 | |
| Sn—1Ag—0.1Bi—4In (Cu addition) | 0 | 0 | 0 | 0 | 1 | 1 |
| Sn—1Ag—0.1Bi—4In (Ni addition) | 0 | 0 | 0 | 0 | 1 | |
| Sn—1Ag—0.1Bi—4In (Co addition) | 0 | 0 | 0 | 0 | 2 | |
| Sn—1Ag—0.1Bi—4In (Fe addition) | 0 | 0 | 0 | 0 | 1 | |
| Sn—1Ag—0.1Bi—4In (Sb addition) | 0 | 0 | 0 | 0 | 3 | |

From Table 1, it was found that as long as the added amount (content) was not more than 1% by weight, all of the samples passed the drop strength test and thus showed a good connection strength, irrespective of the added elements of Cu, Ni, Co, Fe and Sb. On the contrary, for the cases of the added amount of 1.5% by weight and 2% by weight, some samples did not pass the drop strength test, and it showed that they were weak against drop impact. One of reasons of this can be considered as that the solder base phase forming the fillet part of the solder-connecting part became too hard by the added element of Cu, Ni, Co, Fe and Sb, and therefore the impact resistance of the solder-connecting part was reduced.

Thus, in order to promote formation and growth of the Cu—Sn intermetallic compound without losing the impact resistance, the added amount of at least one element selected from the group consisting of Cu, Ni, Co, Fe and Sb is preferably 1.0% by weight or less (excluding 0% by weight) in total sum.

The existence of the above element(s) in minute amounts, for example, not less than 0.05% by weight but not more than 0.1% by weight, is enough to promote formation and growth of the Cu—Sn intermetallic compound. With this content of the added element(s), the blocking structure can be formed by the Cu—Sn intermetallic compound between the electrode part of the electronic component and the electrode land of the substrate earlier than formation and extension of cleavage.

Thus, for the solder material of the present invention, the total content of one or more elements selected from the group consisting of Cu, Ni, Co, Fe and Sb in its metal composition is 1% by weight or less (excluding 0% by weight, for example, not less than 0.05% by weight), particularly 0.1% by weight or less.

As to Cu, Ni, Co, Fe and Sb

The added element(s) is most preferably Co, followed by Ni, Cu and Fe, and Sb with lesser preference in this order (the preference of Cu and Fe is substantially the same). Hereinafter, as to respective elements of Cu, Ni, Co, Fe and Sb, their functions and effects will be explained.

A case of addition of Cu is understood as follows. since an amount of Cu which is a major component of the Cu—Sn intermetallic compound is increased, the formed amount of the Cu—Sn intermetallic compound is directly increased, and thus the blocking structure by the Cu—Sn intermetallic compound is formed between the electrode part of the electronic component and the electrode land of the substrate.

As to Ni, Co and Fe, they are transition metals similarly to Cu, and their atomic radiuses are close to each other. Firstly, however, Ni, Co and Fe are largely different from Cu in that Ni, Co and Fe are not a major component of the Cu—Sn intermetallic compound. Further, there is also a difference even between Ni, Co and Fe.

Ni and Co both do not affect on a melting property (or fusibility) of the solder, and both come into a solid solution uniformly in the Cu—Sn intermetallic compound, so that they function to promote the growth of the Cu—Sn intermetallic compound (thus, to form the blocking structure).

In particular, Co comes into a solid solution in Sn more easily than Ni, and thus Co is advantageous in that a solder material (more specifically a solder alloy) to be supplied to a connecting part of the electronic component can be prepared with good reproducibility (in other words, the solder shows smaller variations in its composition).

Next, Fe tends to be oxidized a little bit more easily than other elements, but is sufficient to exert the functions and effects for promoting the growth of the Cu—Sn intermetallic compound (thus forming the blocking structure).

Also, Sb functions to promote the growth of the Cu—Sn intermetallic compound by coming into a solid solution in the Cu—Sn intermetallic compound. However, since Sb comes into a solid solution also in Sn more easily than other elements, Sb shows a smaller degree of the promotion and requires a little bit more time to form the blocking structure by the Cu—Sn intermetallic compound.

Hereinbefore, the functions and effects for the cases where each of the elements of Cu, Ni, Co, Fe and Sb is added solely have been explained. When two or more of the elements are added in combination, the functions and effects of these added elements will be averaged.

(Process for Producing Electronic Component Assembly)

Next, a process for producing the above described electronic component assembly with reference to FIG. 1 is explained.

Referring to FIG. 6(a), firstly, a solder paste (which is also called as a cream solder) is prepared as a solder material, and it is printed on the substrate 1 according to a printing method to be selectively applied on the electrode land 1a of the substrate 1 through a printing mask. The printing mask having a thickness of 1.5 mm is used, and a size of the electrode land and a size of opening of the mask are those recommended by a manufacturer. The solder paste is one obtained by blending solder particles (e.g. particle diameter of 20-40 μm) having the metal composition of the solder material of the present invention with a flux at a ratio of about 9:1 and adjusting its viscosity to about 200 Pa·s. Regarding the solder particles, as long as the metal composition of the solder material of the present invention is finally obtained as a resultant metal composition, two or more kinds of solder particles having different particle diameters and/or compositions may be mixed for the use.

After that, the electronic component 3 is mounted on the substrate 1 by using a component mounter (i.e. a component-mounting apparatus) so that the electrode part 3a of the electronic component 3 is located on the solder paste printed on the electrode land 1a of the substrate 1.

Then, the substrate 1 on which the electronic component is mounted is passed through a reflow furnace for heating in which the solder particles melt and the electrode part 3a of the electronic component 3 is connected to the electrode land 1a of the substrate 1 by a connecting part formed by using the solder material. A temperature profile for the reflow heating may include, for example, preheating from 150° C. to 170° C. for about 100 seconds, and then heating retained at 240° C. for 3 minutes. This reflow heating includes aging (heating for growing the intermetallic compound). During this reflow heating, while the electronic component is connected, the Cu—Sn intermetallic compound grows.

Thus, the electronic component assembly 10 as shown in FIG. 1 is obtained. In the connecting part 5 of the electronic component assembly 10, a space between the electrode part 3a of the electronic component 3 and the electrode land 1a of the substrate 1 is at lest partially blocked by the Cu—Sn intermetallic compound 5a, and a part other than the above space is composed of the solder base phase 5b.

If the electronic component has a difficulty in its heat resistance, omitting the aging from the reflow heating and following the reflow heating, the substrate may be heated at a temperature not larger than the heatproof temperature of the electronic component 3 for a certain period of time or more as aging to grow the Cu—Sn intermetallic compound.

Hereinbefore, one embodiment of the present invention has been explained. However, the present invention is not limited thereto, and may be modified variously.

For example, although the electrode part of the electronic component and the electrode land of the substrate both comprise copper in the above embodiment, at least surface of the electrode part and the electrode land may be composed of any other metal than copper (e.g. surface treated with Ni/Au). In this case, by using a solder material containing Cu as the solder material of the present invention, an intermetallic compound (e.g. Cu—Ni—Sn intermetallic compound) is formed between Sn and Cu in the solder material and a metal to be connected (e.g. Ni), and this intermetallic compound can grow to form a blocking structure similar to that shown in FIG. 1.

Further, although the reflow heating includes the aging as shown in FIG. 6(a) or the reflow heating is followed by the aging in the above embodiment, the aging is not necessary. The reflow heating may be conducted only at the conventional level (e.g. retained at a temperature not less than 220° C. for 20 seconds). In this case, the growth of the intermetallic compound is not sufficient in the electronic component assembly, but the intermetallic compound may form the blocking structure during actual use by user so that a good durability (thermal fatigue resistance) which is equal to that in the above embodiment can develop.

Furthermore, although FIGS. 1 and 2 show the electronic component assembly in which a chip component is used as the electronic component for the above embodiment, any electronic component having a high-temperature (e.g. 150° C.) resistance is used. Also in cases where a lead-type (or leaded) electronic component as well as a semiconductor package such as QFP (Quad Flat Package), SOP (Small Outline Package), diode, transistor, or the like is mounted by SMT (Surface Mount Technology), similar functions and effects can be obtained. In addition, the substrate is not limited to a resin-based substrate such as an epoxy-based substrate, an inorganic substrate such as an iron-based or ceramic-based substrate can also be used.

EXAMPLES

With the use of a solder material having various metal compositions shown in Tables 2 and 3, an electronic component assembly shown in FIG. 1 was prepared according to the flow diagram of steps explained above with reference to FIG. 6(a) under conditions below. In Tables 2 and 3, "Bal." means remainder (balance).

Substrate 1: High Tg type, high heat resistant substrate R-1755T, double-sided with copper, thickness of 1.2 mm (Panasonic Electric Works Co., Ltd.)

Electronic land 1a: Cu land, thickness of 35 μm, having subjected to surface treatment by a pre-flux preparation agent ("Tough-Ace", SHIKOKU CHEMICALS CORPORATION)

Resist 1b: High heat resistant resist (TAIYO INK MFG. CO., LTD.)

Electronic component 3: Chip capacitor, size of 1005, (TDK Corporation, C1005)

Electrode part 3a: Cu electrode (TDK Corporation, C1005)

Mounting process: reflow soldering (following preheating from 150° C. to 170° C. for about 100 seconds, heating was continued at 240° C. for 3 minutes)

Thus prepared samples of the electronic component assembly were subjected to a heat cycle test between −40° C. and 150° C. with 3,000 cycles, and then they were evaluated on whether cleavage (crack) causing disconnection was occurred or not by cross-section observation between the electrode part of the electronic component and the electrode land of the substrate. The number of samples (N) was five for each of the metal compositions. The results of judgment are also shown in Tables 2 and 3.

TABLE 2

Results of Heat cycle test

| | Metal Composition (% by weight) | | | | | | | | | Judgment (Number of |
| --- | --- | --- | --- | --- | --- | --- | --- | --- | --- | --- |
| | Sn | Ag | Bi | In | Cu | Ni | Co | Fe | Sb | disconnection) |
| Example 1 | Bal. | 1.0 | 0.1 | 4.0 | 0.5 | — | — | — | — | Not disconnected (0) |
| Example 2 | Bal. | 1.0 | 0.1 | 6.0 | 0.5 | — | — | — | — | Not disconnected (0) |
| Example 3 | Bal. | 4.0 | 0.1 | 4.0 | 0.5 | — | — | — | — | Not disconnected (0) |
| Example 4 | Bal. | 4.0 | 0.1 | 6.0 | 0.5 | — | — | — | — | Not disconnected (0) |
| Example 5 | Bal. | 1.0 | 1.0 | 4.0 | 0.5 | — | — | — | — | Not disconnected (0) |
| Example 6 | Bal. | 1.0 | 1.0 | 6.0 | 0.5 | — | — | — | — | Not disconnected (0) |
| Example 7 | Bal. | 4.0 | 1.0 | 4.0 | 0.5 | — | — | — | — | Not disconnected (0) |
| Example 8 | Bal. | 4.0 | 1.0 | 6.0 | 0.5 | — | — | — | — | Not disconnected (0) |
| Example 9 | Bal. | 1.0 | 0.1 | 4.0 | 1.0 | — | — | — | — | Not disconnected (0) |
| Example 10 | Bal. | 1.0 | 0.1 | 6.0 | 1.0 | — | — | — | — | Not disconnected (0) |
| Example 11 | Bal. | 4.0 | 0.1 | 4.0 | 1.0 | — | — | — | — | Not disconnected (0) |
| Example 12 | Bal. | 4.0 | 0.1 | 6.0 | 1.0 | — | — | — | — | Not disconnected (0) |
| Example 13 | Bal. | 1.0 | 1.0 | 4.0 | 1.0 | — | — | — | — | Not disconnected (0) |
| Example 14 | Bal. | 1.0 | 1.0 | 6.0 | 1.0 | — | — | — | — | Not disconnected (0) |

TABLE 2-continued

Results of Heat cycle test

| | Metal Composition (% by weight) | | | | | | | | Judgment (Number of |
|---|---|---|---|---|---|---|---|---|---|
| | Sn | Ag | Bi | In | Cu | Ni | Co | Fe | Sb | disconnection) |
| Example 15 | Bal. | 4.0 | 1.0 | 4.0 | 1.0 | — | — | — | — | Not disconnected (0) |
| Example 16 | Bal. | 4.0 | 1.0 | 6.0 | 1.0 | — | — | — | — | Not disconnected (0) |
| Comparative Example 1 | Bal. | 1.0 | 0.1 | 4.0 | — | — | — | — | — | Disconnected (3) |
| Comparative Example 2 | Bal. | 1.0 | 0.1 | 6.0 | — | — | — | — | — | Disconnected (3) |
| Comparative Example 3 | Bal. | 4.0 | 0.1 | 4.0 | — | — | — | — | — | Disconnected (2) |
| Comparative Example 4 | Bal. | 4.0 | 0.1 | 6.0 | — | — | — | — | — | Disconnected (1) |
| Comparative Example 5 | Bal. | 1.0 | 1.0 | 4.0 | — | — | — | — | — | Disconnected (3) |
| Comparative Example 6 | Bal. | 1.0 | 1.0 | 6.0 | — | — | — | — | — | Disconnected (3) |
| Comparative Example 7 | Bal. | 4.0 | 1.0 | 4.0 | — | — | — | — | — | Disconnected (2) |
| Comparative Example 8 | Bal. | 4.0 | 1.0 | 6.0 | — | — | — | — | — | Disconnected (1) |
| Comparative Example 9 | Bal. | 0.5 | 1.0 | 6.0 | 0.5 | — | — | — | — | Disconnected (3) |
| Comparative Example 10 | Bal. | 0.5 | 1.0 | 6.0 | 1.0 | — | — | — | — | Disconnected (3) |
| Comparative Example 11 | Bal. | 0.5 | 1.0 | 3.0 | 0.5 | — | — | — | — | Disconnected (3) |
| Comparative Example 12 | Bal. | 0.5 | 1.0 | 3.0 | 1.0 | — | — | — | — | Disconnected (3) |
| Comparative Example 13 | Bal. | 4.0 | 1.0 | 7.0 | 0.5 | — | — | — | — | Disconnected (3) |
| Comparative Example 14 | Bal. | 4.0 | 1.0 | 7.0 | 1.0 | — | — | — | — | Disconnected (3) |

TABLE 3

Results of Heat cycle test

| | Metal Composition (% by weight) | | | | | | | | Judgment (Number of |
|---|---|---|---|---|---|---|---|---|---|
| | Sn | Ag | Bi | In | Cu | Ni | Co | Fe | Sb | disconnection) |
| Example 17 | Bal. | 3.5 | 0.5 | 4.0 | — | 0.05 | — | — | — | Not disconnected (0) |
| Example 18 | Bal. | 3.5 | 0.5 | 6.0 | — | 0.05 | — | — | — | Not disconnected (0) |
| Example 19 | Bal. | 3.5 | 0.5 | 4.0 | — | 0.1 | — | — | — | Not disconnected (0) |
| Example 20 | Bal. | 3.5 | 0.5 | 6.0 | — | 0.1 | — | — | — | Not disconnected (0) |
| Example 21 | Bal. | 3.5 | 0.5 | 4.0 | — | — | 0.05 | — | — | Not disconnected (0) |
| Example 22 | Bal. | 3.5 | 0.5 | 6.0 | — | — | 0.05 | — | — | Not disconnected (0) |
| Example 23 | Bal. | 3.5 | 0.5 | 4.0 | — | — | 0.1 | — | — | Not disconnected (0) |
| Example 24 | Bal. | 3.5 | 0.5 | 6.0 | — | — | 0.1 | — | — | Not disconnected (0) |
| Example 25 | Bal. | 3.5 | 0.5 | 4.0 | — | — | — | 0.05 | — | Not disconnected (0) |
| Example 26 | Bal. | 3.5 | 0.5 | 6.0 | — | — | — | 0.05 | — | Not disconnected (0) |
| Example 27 | Bal. | 3.5 | 0.5 | 4.0 | — | — | — | 0.1 | — | Not disconnected (0) |
| Example 28 | Bal. | 3.5 | 0.5 | 6.0 | — | — | — | 0.1 | — | Not disconnected (0) |
| Example 29 | Bal. | 3.5 | 0.5 | 4.0 | — | — | — | — | 0.05 | Not disconnected (0) |
| Example 30 | Bal. | 3.5 | 0.5 | 6.0 | — | — | — | — | 0.05 | Not disconnected (0) |
| Example 31 | Bal. | 3.5 | 0.5 | 4.0 | — | — | — | — | 0.1 | Not disconnected (0) |
| Example 32 | Bal. | 3.5 | 0.5 | 6.0 | — | — | — | — | 0.1 | Not disconnected (0) |
| Comparative Example 15 | Bal. | 3.5 | 0.5 | 4.0 | — | — | — | — | — | Disconnected (2) |
| Comparative Example 16 | Bal. | 3.5 | 0.5 | 6.0 | — | — | — | — | — | Disconnected (1) |
| Comparative Example 17 | Bal. | 3.5 | 0.5 | 3.0 | — | 0.05 | — | — | — | Disconnected (3) |
| Comparative Example 18 | Bal. | 3.5 | 0.5 | 3.0 | — | 0.1 | — | — | — | Disconnected (3) |
| Comparative Example 19 | Bal. | 3.5 | 1.0 | 7.0 | — | 0.05 | — | — | — | Disconnected (3) |
| Comparative Example 20 | Bal. | 3.5 | 1.0 | 7.0 | — | 0.1 | — | — | — | Disconnected (3) |
| Comparative Example 21 | Bal. | 3.5 | 0.5 | 3.0 | — | — | 0.05 | — | — | Disconnected (3) |
| Comparative | Bal. | 3.5 | 0.5 | 3.0 | — | — | 0.1 | — | — | Disconnected (3) |

TABLE 3-continued

Results of Heat cycle test

| | Metal Composition (% by weight) | | | | | | | | | Judgment (Number of disconnection) |
|---|---|---|---|---|---|---|---|---|---|---|
| | Sn | Ag | Bi | In | Cu | Ni | Co | Fe | Sb | |
| Example 22 | | | | | | | | | | |
| Comparative Example 23 | Bal. | 3.5 | 0.5 | 7.0 | — | — | 0.05 | — | — | Disconnected (3) |
| Comparative Example 24 | Bal. | 3.5 | 0.5 | 7.0 | — | — | 0.1 | — | — | Disconnected (3) |
| Comparative Example 25 | Bal. | 3.5 | 0.5 | 3.0 | — | — | — | 0.05 | — | Disconnected (3) |
| Comparative Example 26 | Bal. | 3.5 | 0.5 | 3.0 | — | — | — | 0.1 | — | Disconnected (3) |
| Comparative Example 27 | Bal. | 3.5 | 0.5 | 7.0 | — | — | — | 0.05 | — | Disconnected (3) |
| Comparative Example 28 | Bal. | 3.5 | 0.5 | 7.0 | — | — | — | 0.1 | — | Disconnected (3) |
| Comparative Example 29 | Bal. | 3.5 | 0.5 | 3.0 | — | — | — | — | 0.05 | Disconnected (3) |
| Comparative Example 30 | Bal. | 3.5 | 0.5 | 3.0 | — | — | — | — | 0.1 | Disconnected (3) |
| Comparative Example 31 | Bal. | 3.5 | 0.5 | 7.0 | — | — | — | — | 0.05 | Disconnected (3) |
| Comparative Example 32 | Bal. | 3.5 | 0.5 | 7.0 | — | — | — | — | 0.1 | Disconnected (3) |

Referring to Tables 2 and 3, in all of Examples 1-16 (Table 2) and Examples 17-32 (Table 3) of the present invention, occurrence of cleavage causing disconnection was not observed. On the other hand, in all of Comparative examples 1-14 (Table 2) and Comparative examples 15-32 (Table 3), occurrence of cleavage causing disconnection was observed.

In Examples 1-32 of the present invention, it was found that in a solder-connecting part, a blocking structure by a Cu—Sn intermetallic compound was formed in an intervening part with which the electrode part of the electronic component and the electrode land of the substrate were opposed to each other, and it was confirmed that the connection is attained with a high connection reliability. On the other hand, in Comparative examples 1-32, such blocking structure by a Cu—Sn intermetallic compound was not formed, and a solder base phase existed as a continuous phase extending entirely between the electrode part of the electronic component and the electrode land of the substrate.

Figure 7A:
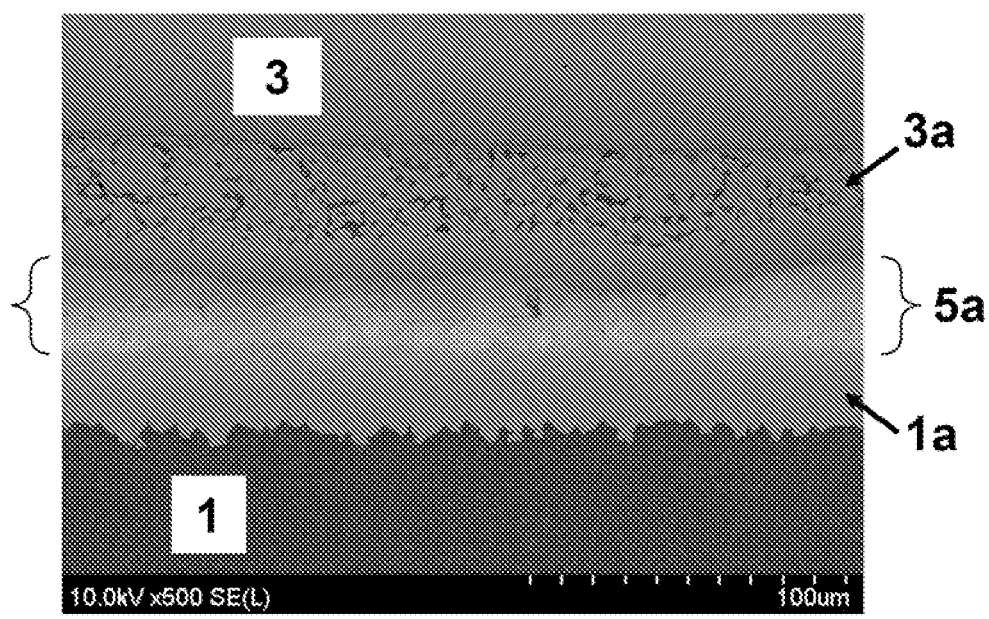
FIG. 7(a) is for a case of Example 2.
Figure 7B:
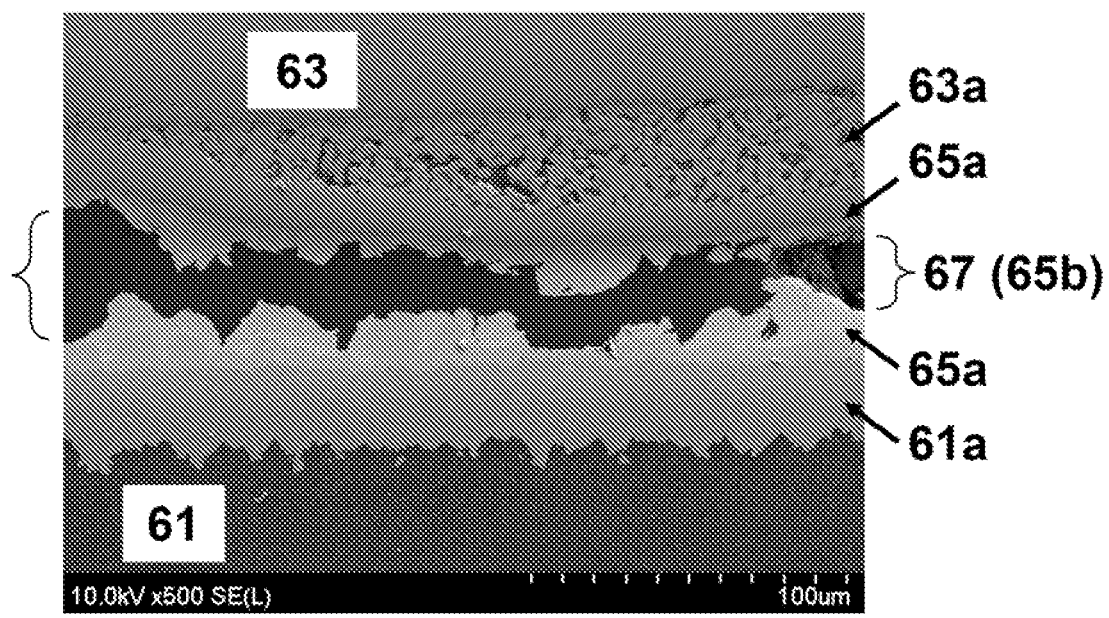
FIG. 7(b) is for a case of Comparative example 2.
Figure 8:
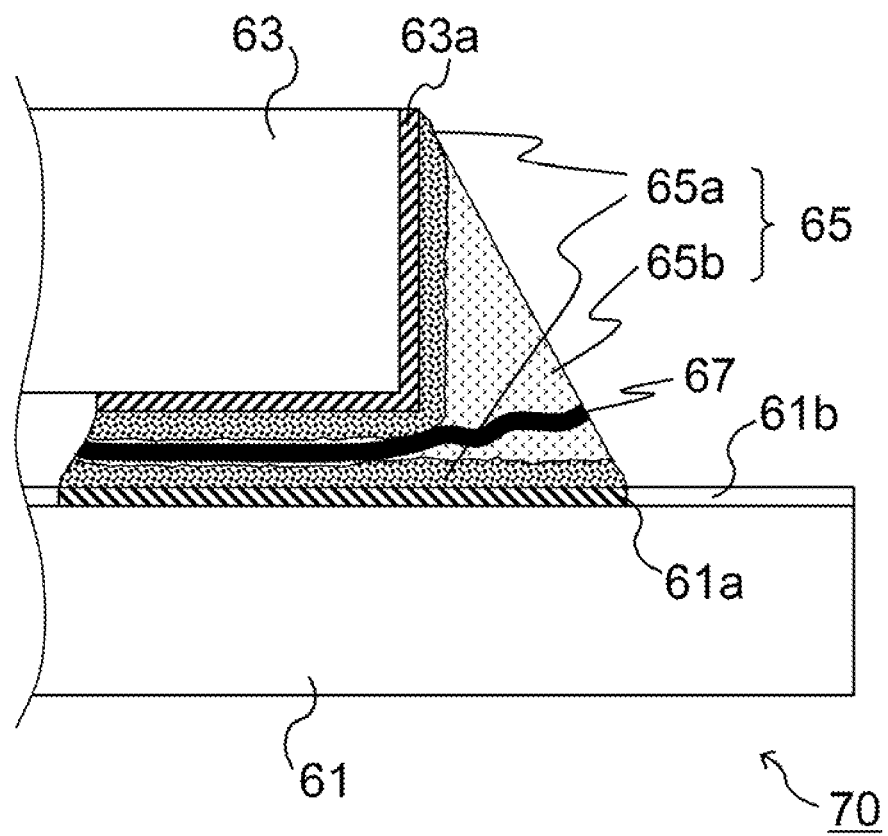
FIG. 8 schematically shows a sectional view of a part of an electronic component assembly in which an electronic component is connected to a substrate by using a conventional solder material.

As an exemplary purpose, SEM photographs of the intervening part with which the electrode part of the electronic component and the electrode land of the substrate were opposed to each other, with respect to the electronic component assembly of Example 2 and Comparative example 2 are shown in FIGS. 7(a) and (b), respectively (for make them easier to understand, the reference signs corresponding to FIGS. 1 and 8 are shown in FIGS. 1(a) and (b)). From FIG. 7(a), it was confirmed in Example 2 that a blocking structure by the Cu—Sn intermetallic compound 5a was formed between the electrode land 1a of the substrate 1 and the electrode part 3a of the electronic component 3 and that cleavage did not exist (neither formed nor extended). On the other hand, from FIG. 7(b), in Comparative example 2, the cleavage 67 was observed between the Cu—Sn intermetallic compounds 65a in the intervening part of the electrode land 61a of the substrate 61 and the electrode part 63a of the electronic component 63 (in FIG. 7(b), the Cu—Sn intermetallic compounds 65a were relatively white regions, and a relatively black region between them was the cleavage 67, the cleavage 67 was derived and generated from the fact that the solder base phase 65b existed there).

In the above Examples, Sn-(1.0-4.0)Ag-(4.0-6.0)In-(0.1-1.0)Bi was added with Cu, Ni, Co, Fe or Sb. As the added element, considering the effects of the respective elements, Co is the most preferable, followed by Ni, Cu and Fe, and Sb with lesser preference in this order (the preference of Cu and Fe is substantially the same). Among Examples 1-32, the most preferable is Example 24 (Sn-3.5Ag-0.5Bi-6.0In-0.1Co).

When an electronic component assembly is produced by using the solder material of the present invention, in an application subjected to a severe temperature environment such as an engine compartment of an automobile, or even in a case of long-term use at a position where maintenance and repair is difficult, e.g. for an application of a solar battery or an artificial satellite, it becomes possible to show a high thermal fatigue resistance and effectively reduce occurrence of connection failure that would cause a function of a product to stop.

The invention claimed is:

1. An electronic component assembly, comprising:
    a substrate including a copper containing electrode land; and
    an electronic component including a copper-containing electrode part connected to the copper-containing electrode land of the substrate by a connecting part, the connecting part being formed by a solder material,
    wherein the solder material comprises 1.0-4.0% by weight of Ag, 4.0-6.0% by weight of In, 0.1-1.0% by weight of Bi, 0.05-0.1% by weight of only one element selected from the group consisting of Ni, Co, Fe and Sb, and a remainder of Sn only, wherein a Cu—Sn intermetallic compound blocks a space between the electrode part of the electronic component and the electrode land of the substrate at least partially in the connecting part.

2. A process for producing an electronic component assembly wherein a copper-containing electrode part of an electronic component is connected to a copper-containing electrode land of a substrate by a connecting part which is formed by using a solder material, the process comprising:
    connecting a copper-containing electrode part of an electronic component to a copper-containing electrode land of a substrate by a solder material which comprises 1.0-4.0% by weight of Ag, 4.0-6.0% by weight of In, 0.1-1.0% by weight of Bi, 0.05-0.1% by weight of only one element selected from the group consisting of Ni, Co, Fe and Sb, and a remainder of Sn only, and growing a Cu—Sn intermetallic compound form both of the electrode part of the electronic component and the electrode land of the substrate by heat treatment until the Cu—Sn intermetallic compound blocks a space between the electrode part of the electronic component and the electrode land of the substrate at least partially in the connecting part.

3. An electronic component assembly, comprising:

a substrate including a copper-containing electrode land; and an electronic component including a copper-containing electrode part connected to the copper-containing electrode land of the substrate by a connecting part, the connecting part being formed by a solder material, wherein the solder material comprises 1.0-4.0% by weight of Ag, 6.0% by weight of In, 0.1-1.0% by weight of Bi, 0.5-1.0% by weight of Cu, and a remainder of Sn only, wherein a Cu—Sn intermetallic compound blocks a space between the electrode part of the electronic component and the electrode land of the substrate at least partially in the connecting part which is formed by using the solder material.

4. A process for producing an electronic component assembly wherein a copper-containing electrode part of an electronic component is connected to a copper-containing electrode land of a substrate by a connecting part which is formed by using a solder material, the process comprising:

connecting a copper-containing electrode part of an electronic component to a copper-containing electrode land of a substrate by a solder material, the solder material comprising 1.0-4.0% by weight of Ag, 6.0% by weight of In, 0.1-1.0% by weight of Bi, 0.5-1.0% by weight of Cu, and a remainder of Sn only, and growing a Cu—Sn intermetallic compound form both of the electrode part of the electronic component and the electrode land of the substrate by heat treatment until the Cu—Sn intermetallic compound blocks a space between the electrode part of the electronic component and the electrode land of the substrate at least partially in the connecting part.

* * * * *